United States Patent [19]
Minuhin et al.

[11] Patent Number: 4,875,108
[45] Date of Patent: Oct. 17, 1989

[54] PHASE LOCK LOOP

[75] Inventors: Vadim B. Minuhin, Bloomington; Evgeny J. Berzon, St. Louis Pk.; Vernon F. VonDeylen, Bloomington, all of Minn.

[73] Assignee: Magnetic Peripherals Inc., Minneapolis, Minn.

[21] Appl. No.: 227,216

[22] Filed: Aug. 2, 1988

[51] Int. Cl.[4] ............................ G11B 5/09; H03L 7/00
[52] U.S. Cl. ........................................ 360/51; 331/1 A
[58] Field of Search .................... 360/51; 375/81, 119; 331/1 A; 328/133

[56] References Cited

U.S. PATENT DOCUMENTS

| 4,005,479 | 1/1977 | Hunnicutt et al. | 360/51 |
| 4,376,268 | 3/1983 | Moriya et al. | 360/51 |
| 4,577,241 | 3/1986 | Wilkinson | 360/51 |
| 4,580,176 | 4/1986 | Graves et al. | 360/51 |
| 4,712,076 | 12/1987 | Cronch et al. | 331/16 |
| 4,754,225 | 6/1988 | Minuhin | 328/133 |

OTHER PUBLICATIONS

Adaptec, Inc., "AIC-6225 High-Performance Monolithic Data Seperator", Copyright 1987, pp. 1-17 and 20-23.

EDN News "Data Seperator Runs at 33M BPS", Aug. 1987, pp. 5 and 15.

Silicon Systems, Inc., Data Book "SSI 32D531 Data Seperator and Write Precompensation Circuit", 6/87, pp. 3-2 thru 3-37.

IBM Technical Disclosure Bulletin, "Phase-Locked Oscillator Charge Pump", vol. 29, No. 2, Jul. 1986, pp. 553-555.

Primary Examiner—Vincent P. Canney
Attorney, Agent, or Firm—Joseph A. Genovese; Robert M. Angus

[57] ABSTRACT

A phase lock loop includes a phase shift apparatus to provide a plurality (i.e., four) phase-shifted clock signals from the VCO. A phase selector is responsive to a triggering signal from a one-shot multivibrator to select the one phase-shifted clock signal next following termination of the trigger signal. The one-shot is responsive to a change between the read and write mode to initiate operation of the phase selector. As a result, the initial phase error between the input signal (read pulses or write clock) and the clock signal of the phase lock loop is no more than ⅛ window.

7 Claims, 3 Drawing Sheets

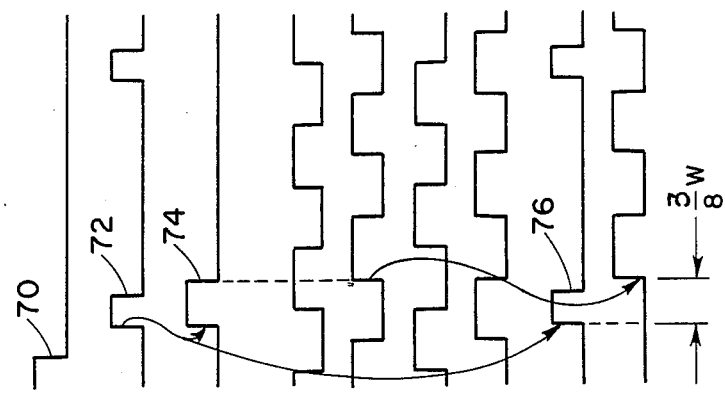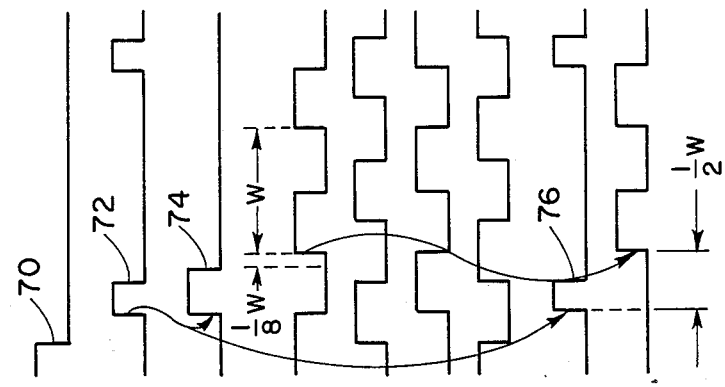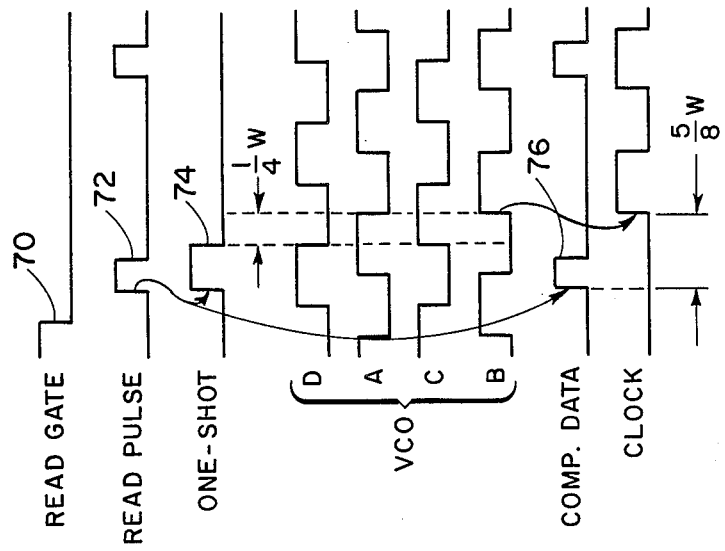

PHASE LOCK LOOP

BACKGROUND OF THE INVENTION

This invention relates to phase lock loops employed in recording or recovering data.

Phase lock loops (PLL) are employed in data reading and recording. In the write mode, the PLL is employed to lock the recording circuitry onto the write clock signal. In the read mode, the PLL is employed to generate a clock signal, based on the recovered data pulses, for the recovery of data. Although data recovery and writing is accomplished at nominally the same frequency, there is often a substantial phase shift between the phase of recovered data and the phase of the write clock signal.

In typical data recovery systems, a preamble containing clocking information is written before the data. The PLL is designed to lock onto the recorded clocking information in the preamble to correct phase differences before the arrival of data. To avoid wasting valuable storage space due to large preambles, it is important that the PLL be designed to lock very rapidly onto the input signal. However, if the PLL operates too rapidly, it is likely to be sensitive to noise and pulse jitter, caused by imperfect heads and disks. Consequently, it is important that the PLL be designed to operate to lock onto phase changes as slowly as practical to ignore noise and pulse jitter. In most prior systems, the time constant of the PLL was designed at an optimum tradeoff to achieve a minimum of wasted space at a response time great enough to filter most signal noise. The present invention, however, is directed at apparatus to reduce the time required for phase lock, without affecting the time constant of the PLL. Particularly, the present invention is directed at reducing the initial phase error between the read and write modes.

Other techniques have been suggested for reducing the time for initial phase lock. U.S. Pat. No. 4,712,076 to R. D. Crouch et al, for example, describes a PLL which ordinarily locks onto every other data pulse, and which provides rapid lock-on by responding to every data pulse. However, the Crouch et al approach did not fully address the problem of rapid lock-on at mode shift, and the apparatus was slow in responding to changes in the normal data stream. IBM Technical Disclosure Bulletin, Vol 29, No. 2, pp. 553-555 describes a phase locked oscillator charge pump wherein the bandwidth/gain of the phase lock oscillator and charge pump current is increased during lock-in mode. The IBM approach, however, requires substantially more and complex circuitry, and may have difficulties due to switching transients. Other systems employ start-stop techniques wherein the voltage controlled oscillator (VCO) of the PLL is stopped and restarted at each lock-in mode shift. These systems suffer from transient difficulties, as well as problems in set-up time at restart. Examples of these stop-start systems may be found in the High-Performance Monolithic Data Separator, AIC-6225, from Adaptec, Inc. of Milpitas, California, and SSI 32D531 Data Separator and Write Precompensation Circuit from Silicon Inc. of Tustin, Calif. U.S. Pat. No. 4,005,479 to R. Hunnicutt et al. describes a system wherein the VCO is operated at a finite multiple (N) of the clock signal and the multiplied signal is frequency divided by the same number. The divider is reset at each mode shift so the maximum phase error will be $\pi/N$ radians. However, operating the VCO at a multiple of the clock signal can lead to problems, especially where the intended data recovery is of the order to 100 MHz.

It is, therefore, an object of the present invention to provide a phase lock loop apparatus capable of locking onto an input signal in a minimum period of time, without reducing the response time of the phase lock loop so as to make it more sensitive to noise and pulse jitter.

Another object of the present invention is to provide apparatus for a phase lock loop to reduce initial phase error upon mode switching between input signals.

BRIEF SUMMARY OF THE INVENTION

A phase lock loop, according to the present invention, employs a voltage controlled oscillator providing four output signals, each at the same frequency, but phase shifted by 90° from each other. Selection apparatus, responsive to the input, selects the one of the four oscillator outputs having a phase closest to that of the input. As a result, the initial phase error will be no more than one-eighth of the detection window ($\pi/4$ radians).

One feature of the present invention resides in the fact that initial phase lock is accomplished without introduction of significant error or the use of complicated circuitry.

Another feature of the present invention resides in the fact that the phase lock loop achieves faster pull in time with better noise immunity than prior phase lock loops, as response time does not need to be compromised between the two criteria.

Another feature of the present invention resides in the fact that initial phase error reduction is accomplished without stopping and restarting the PLL on mode change and without multiplying the running clock frequency.

BRIEF DESCRIPTION OF THE DRAWINGS

The above and other features of this invention will be more fully understood from the following detailed description, and the accompanying drawings, in which:

FIG. 4A through C are diagrams of waveforms useful in explaining the operation of the present invention.

DETAILED DESCRIPTION

Figure 1:
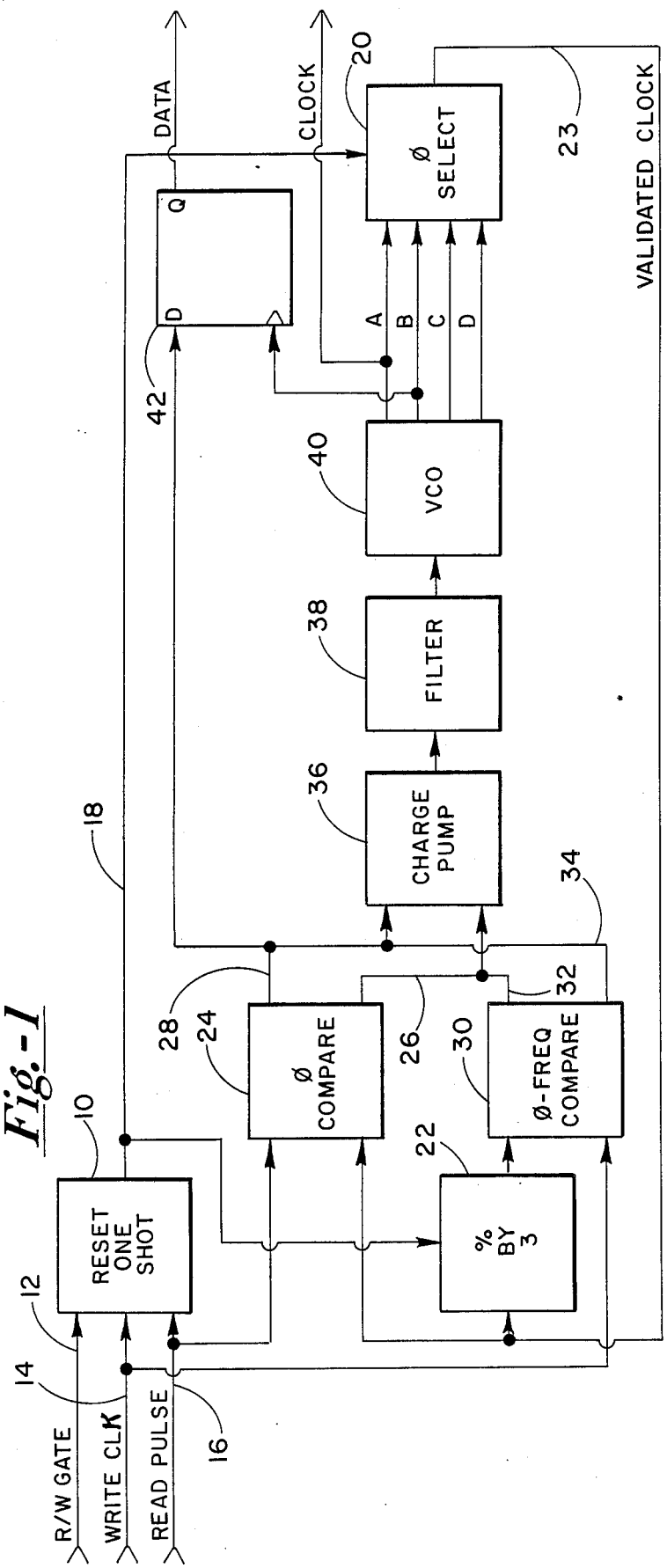
FIG. 1 is a block circuit diagram of a phase lock loop according to the presently preferred embodiment of the present invention.

Referring to the drawings, and particularly to FIG. 1, there is illustrated a phase lock loop (PLL) in accordance with the presently preferred embodiment of the present invention. The apparatus includes a reset one-shot multivibrator 10 having a read/write gate input 12, a write clock input 14 from a write clock generator (not shown), and a read pulse input 16 from the data recovery circuits. Multivibrator 10 provides an output trigger pulse on lead 18 which is ⅜ window in duration. For example, for a recording frequency of 100 MHz, the window will be 10 nanoseconds, so multivibrator 10 would provide a trigger pulse on lead 18 having a duration of 3.75 nanoseconds. Multivibrator 10 will provide a single output pulse 74 (FIG. 4) on lead 18 upon the positive edge of a write clock signal on lead 14 following a change of the read/write gate signal on lead 12 from a low level to a high level. Multivibrator 10 will also provide a single output pulse 74 (FIG. 4) on lead 18 upon the positive edge of the first read pulse signal on lead 16 following a change of the read/write gate signal on lead 12 from a high level to a low level. Multivibrator 10 provides its output pulse via lead 18 to reset phase selector 20 and to reset divide by 3 counter 22. The read/write gate signal is provided as indicative of the read or write mode of the apparatus.

As will be more fully understood hereinafter, phase selector 20 provides a validated clock signal output on lead 23. The validated clock signal is also provided as an input to counter 22 and to read phase comparator 24. Read phase comparator 24 also receives the read pulses recovered from the media (not shown) on lead 16 and provides a pump up signal on lead 26 and a pump down on lead 28. An example of a read phase comparator 24 may be found in U.S. Pat. No. 4,754,225 granted June 28, 1988, for "Phase Comparator Insensitive to Clock Asymmetry" by V. B. Minuhin, and assigned to the same assignee as the present invention. Write phase/frequency comparator 30 receives the output of divide by 3 counter 22 and also the write clock signal on lead 14. Write phase/frequency comparator 30 provides pump up signals on lead 32 and pump down signals on lead 34. Charge pump 36 receives the pump up signal from either lead 26 or lead 32 and the pump down signal from either lead 28 or lead 34, and provides a DC voltage signal through loop filter 38 to voltage controlled oscillator (VCO) 40. The pump down signal from the read phase comparator 24 is provided to the D input of D-type flip-flop 42 for data recovery purposes.

VCO 40 is operable in response to the filtered DC signal from charge pump 36 to provide a pulse signal output at a frequency determined by the DC level of the input signal. Charge pump 36 increases or decreases the signal level to VCO 40 in accordance with the pump up and pump down signals received from either the read phase comparator 24 or write phase/frequency comparator 30. In the case of the read mode, read phase comparator 24 compares the validated clock signal on lead 23 to the read pulse signal on lead 16, as explained in the aforesaid Minuhin patent. In the event of a phase error, the pump up and pump down signals are unequal to adjust the DC signal from pump 36 to adjust the frequency, and hence the phase, of the VCO 40. Likewise, in the write mode, the read phase/frequency comparator 30 compares the output of the write clock signal on lead 14 to the validated clock signal on lead 23 via counter 22. In the mode, contemplated, the write clock signal is actually operated at a frequency equal to one-third the validated clock signal, so it is necessary to divde the frequency of the validated clock by 3 in counter 22. In any case, the charge pump 36 continually adjusts the signal to VCO 40 to adjust the phase output thereof in accordance with either the write clock signal 14 or the read pulse signal 16, as the case may be.

Figure 2:
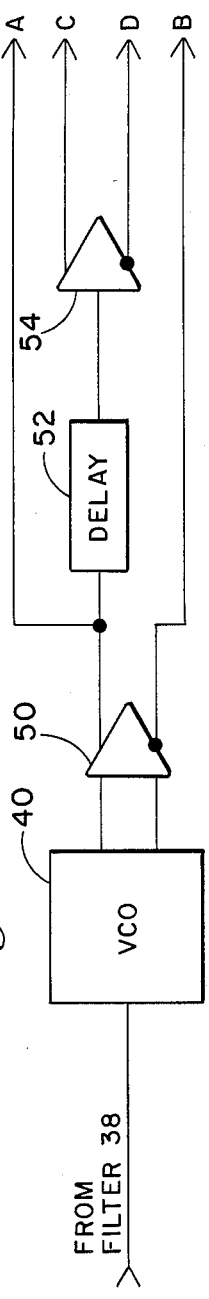
FIG. 2 is a simplified block circuit diagram of a voltage controlled oscillator for achieving the phase shifted signals used in the present invention.

Referring to FIG. 2, there is illustrated the apparatus for achieving the four phase shifted signals from VCO 40. VCO 40 receives the input signal from filter 38 and provides an output to inverting amplifier 50. The positive side of inverting amplifier 50 is provided as a first phase A and the inverted output is taken as a second phase B, 180° apart from phase A. The positive side of inverting amplifier 50 is also processed through delay circuit 52 to inverting amplifier 54 which also provides a noninverted output C and an inverted output signal D. Delay 52 is operable to delay the output signal A by a time period equal to one-quarter of a detection window (2.5 nanoseconds in the case of a 10 nanosecond window). Thus, the signals at phases A, B, C, and D are each at the same frequency, but are phase shifted 90° apart. These signals are provided to phase selector 20, shown in FIG. 3.

Figure 3:
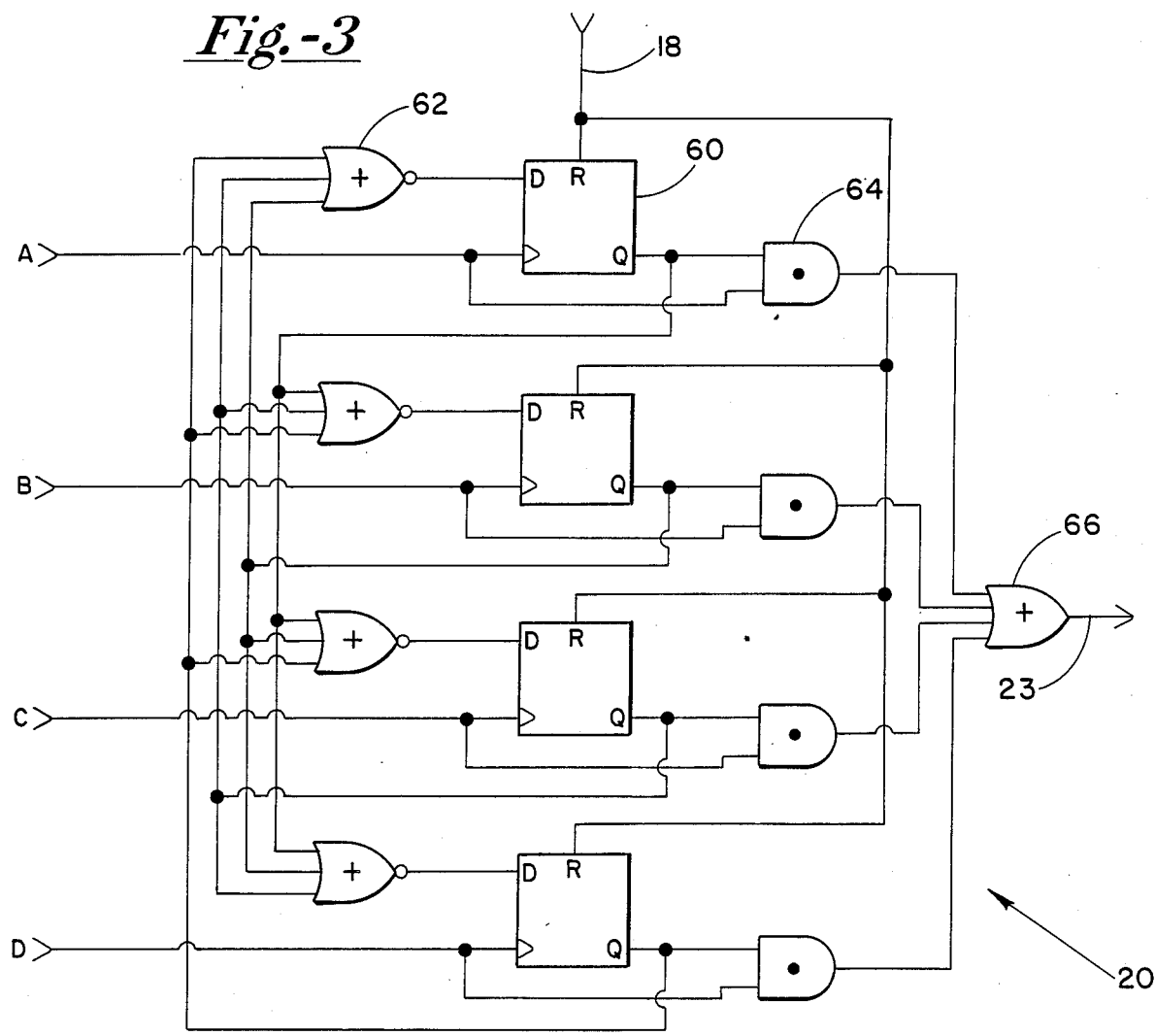
FIG. 3 is a block circuit diagram of a phase selector used in the present invention.

Although the phase selector shown in FIG. 3 need not be described in detail, it comprises a plurality of four resettable D-type flip-flops 60, each having its D input connected to the output of a NOR gate 62 having inputs from the Q outputs of the other three D-type flip-flops. The signal from multivibrator 10 on lead 18 is provided as a reset to each of the D-type flip-flops 10 so that on termination of the $\frac{3}{8}$ window signal from multivibrator 10, the next output A, B, C or D from VCO 40 operates on the clock input of the respective D-type flip-flop 60 to set the Q output thereof high and to operate through AND gate 64 and OR gate 66 to provide a validated clock output. The high Q output of the selected D-type flip-flop operates through the other NOR gate 62 to effectively block the D input of the other flip-flops 60 and lock them out of operation. Hence, repeated clock signals from the VCO 40 of the selected phase are continuously operated through the selected AND gate 64 and OR gate 66.

Data is recovered via flip-flop 42 from the clock input thereof tied to the output of the B phase of VCO 44.

The operation of the apparatus may be explained with reference to the timing diagram of FIG. 4. FIG. 4 illustrates the timing of the signals when the data pulse or write clock pulse is normally in phase or out of phase with the VCO. Assuming the apparatus mode is switched from write to read mode, read/write gate signal 70 goes low so that the next read or data pulse 72 operates one-shot multivibrator 10 to produce a single triggering pulse 74 having a duration equal to $\frac{3}{8}$ of the window W. (At 100 MHz, window W will be 10 nanoseconds in duration, so multivibrator 74 would be designed to produce a pulse nominally 3.75 nanoseconds in duration.) The read pulse 72 also operates through phase comparator 24 to produce the separated data pulse 76.

Referring to FIG. 3, trigger pulse 74 on lead 18 also serves to reset all of the flip-flops 60 in phase selector 20. The next pulse signal A, B, C, or D from VCO 40 following termination of the trigger pulse 74 will set the respective flip-flop 60 and lock out all other flip-flops 60. As a result, that one signal train thereafter acts as the VCO output selected by phase selector 20 and processed through OR gate 66. The phase error will be no more than $\frac{1}{8}$ window duration. For example, in FIG. 4A the data pulse 72 is at a maximum early condition of $\frac{1}{8}$ window early of VCO signal B. Thus, pulse 74 terminates $\frac{1}{8}$ window before the leading edge of a phase B signal, so phase B signal is selected by phase selector 20 to lock onto the data. In FIG. 4C the maximum late condition is shown wherein the data pulse is $\frac{1}{8}$ window late of the phase A signal and pulse 74 terminates immediately before (or coincident with) the leading edge of a phase A pulse. Actually, maximum early and maximum late are close to the same condition, as had the datapulse in FIG. 4A been any earlier, the phase C pulse signal would have been triggered and a near maximum late condition exist.

FIG. 4B illustrates the nominal condition wherein the one-shot pulse 74 terminates $\frac{1}{8}$ window before the next phase pulse (in this case phase D) so the separated data is exactly one-half window from the edge of a window.

In the write mode, the circuit operates in the same manner, locking onto the write clock pulses through comparator 30.

The present invention thus provides a phase lock loop with reduced initial phase error upon switching input mode between read and write modes. The apparatus is simple, and accomplishes the objectives without affecting response time of the phase lock loop or affecting sensitivity to noise and pulse jitter. It is important to note that the signal duration of pulse 74 (being ⅜ window) and the fixed delay of delay circuit 52 (¼ window), are determined by the frequency of the read/write signal. In the case of a 100 MHz signal recovery, multivibrator 10 is designed to provide a one-shot pulse 74 equal to 3.75 nanoseconds, and delay circuit 52 is designed to provide a delay of 2.50 nanoseconds. The duration of pulse 74 and delay provided by delay circuit 52 would be altered to meet the requirements of other recording frequencies.

This invention is not to be limited by the embodiment shown in the drawings and described in the description, which is given by way of example and not of limitation, but only in accordance with the following claims.

What is claimed is:

1. A phase lock loop comprising compare means responsive to an input signal and to a clock signal for determining the phase difference between said input signal and said clock signal; charge pump means responsive to the phase difference determined by said compare means for providing a pump signal; oscillator means responsive to said pump signal for providing a periodic signal having a frequency determined by said pump signal; phase shift means responsive to said oscillator means for providing a plurality of signals each at said frequency of said periodic signal and each phase shifted from the others of said plurality of signals by a predetermined amount; and phase select means for selecting the one of said plurality of signals whose phase is closest to the phase of said input signal, and providing said selected one signal as said clock signal.

2. Apparatus according to claim 1 further including trigger means responsive to a change in a mode signal for providing a trigger signal, said phase elect means being responsive to said trigger means to initiate selection of one of said plurality of signals.

3. Apparatus according to claim 2 wherein said input signal is either a read pulse signal or a write clock pulse signal and said mode signal has first and second states indicative of whether the apparatus is in a read or a write mode, said trigger means being a one-shot multivibrator responsive to the next pulse of a selected one of said read pulse signal or said write clock pulse signal following a change in state of said mode signal to provide said trigger signal.

4. Apparatus according to claim 3 wherein said phase select means includes a plurality of resettable gate means each connected to receive a respective one of said plurality of signals, each of said gate means being responsive to said trigger signal to provide the respective one of said plurality of signals as said clock signal, and inhibit means responsive to the first of said gate means to provide a clock signal to inhibit operation of each of the other gate means.

5. Apparatus according to claim 4 wherein said plurality of signals comprises four signals each phase shifted at least 90° from the others, said trigger signal having a duration equal to about ⅜ of a signal cycle, said gate means being responsive to said trigger signal to reset each of said gate means so that said gate means are each responsive to a respective one of said four signals following termination of said trigger signal to provide said clock signal, whereby the phase error between said clock signal and said input signal is no more than ⅛ cycle.

6. Apparatus according to claim 2 wherein said phase select means includes a plurality of resettable gate means each connected to receive a respective one of said plurality of signals, each of said gate means being responsive to said trigger signal to provide the respective one of said plurality of signals as said clock signal, and inhibit means responsive to the first of said gate means to provide a clock signal to inhibit operation of each of the other gate means.

7. Apparatus according to claim 6 wherein said plurality of signals comprises four signals each phase shifted at least 90° from the others, said trigger signal having a duration equal to about ⅜ of a signal cycle, said gate means being responsive to said trigger signal to reset each of said gate means so that said gate means are each responsive to a respective one of said four signals following termination of said trigger signal to provide said clock signal, whereby the phase error between said clock signal and said input signal is no more than ⅛ cycle.

* * * * *